US012545987B2

(12) United States Patent
Ockenfuss

(10) Patent No.: US 12,545,987 B2
(45) **Date of Patent: *Feb. 10, 2026**

(54) REACTIVE SPUTTER DEPOSITION OF DIELECTRIC FILMS

(71) Applicant: VIAVI Solutions Inc., Chandler, AZ (US)

(72) Inventor: Georg J. Ockenfuss, Santa Rosa, CA (US)

(73) Assignee: VIAVI Solutions Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/171,058

(22) Filed: Feb. 17, 2023

(65) Prior Publication Data

US 2023/0203636 A1 Jun. 29, 2023

Related U.S. Application Data

(63) Continuation of application No. 17/248,738, filed on Feb. 5, 2021, now Pat. No. 11,584,982, which is a (Continued)

(51) Int. Cl.
*H01J 37/34* (2006.01)
*C23C 14/00* (2006.01)
(Continued)

(52) U.S. Cl.
CPC ...... *C23C 14/0036* (2013.01); *C23C 14/0063* (2013.01); *C23C 14/10* (2013.01); (Continued)

(58) Field of Classification Search
CPC . C23C 14/0036; C23C 14/0063; C23C 14/10; C23C 14/3407; H01J 37/3407; H01J 37/34; H01J 37/3417; H01J 37/3464
(Continued)

(56) References Cited

U.S. PATENT DOCUMENTS 3,830,721 A 8/1974 Kozlowski et al.
4,132,357 A * 1/1979 Blackinton ............. B05B 12/18 239/290

(Continued)

FOREIGN PATENT DOCUMENTS

CN 1737190 A 2/2006
CN 1737191 A 2/2006

(Continued)

OTHER PUBLICATIONS

Machine Translation Jp 2010-043334 (Year: 2010).*

(Continued)

*Primary Examiner* — Rodney G Mcdonald
(74) *Attorney, Agent, or Firm* — Harrity & Harrity, LLP

(57) ABSTRACT

Reactive sputter deposition method and system are disclosed, in which a catalyst gas, such as water vapor, is used to increase the overall deposition rate substantially without compromising formation of a dielectric compound layer and its optical transmission. Addition to the sputtering or reactive gas of the catalyst gas can result in an increase of a deposition rate of the dielectric oxide film substantially without increasing an optical absorption of the film.

20 Claims, 4 Drawing Sheets

Related U.S. Application Data continuation of application No. 15/997,079, filed on Jun. 4, 2018, now Pat. No. 10,920,310, which is a continuation of application No. 13/887,013, filed on May 3, 2013, now Pat. No. 9,988,705.

(60) Provisional application No. 61/642,752, filed on May 4, 2012.

(51) Int. Cl.
*C23C 14/10* (2006.01)
*C23C 14/34* (2006.01)

(52) U.S. Cl.
CPC .......... *C23C 14/3407* (2013.01); *H01J 37/34* (2013.01); *H01J 37/3417* (2013.01); *H01J 37/3464* (2013.01)

(58) Field of Classification Search
USPC ................ 204/192.1–192.38, 298.01–298.41
See application file for complete search history.

(56) References Cited

U.S. PATENT DOCUMENTS

| | | | | | |
|---|---|---|---|---|---|
| 4,374,867 | A | | 2/1983 | Nahory et al. | |
| 4,407,709 | A | * | 10/1983 | Enjouji | C23C 14/0042 204/192.15 |
| 4,547,279 | A | | 10/1985 | Kiyota et al. | |
| 4,547,729 | A | | 10/1985 | Adolfsson et al. | |
| 4,851,095 | A | * | 7/1989 | Scobey | C23C 14/56 204/192.15 |
| 4,990,229 | A | * | 2/1991 | Campbell | H01J 37/3211 204/298.37 |
| 5,122,251 | A | | 6/1992 | Campbell et al. | |
| 5,122,252 | A | | 6/1992 | Latz et al. | |
| 5,126,318 | A | | 6/1992 | Gavaler et al. | |
| 5,262,032 | A | | 11/1993 | Hartig et al. | |
| 5,284,564 | A | | 2/1994 | Maass et al. | |
| 5,302,493 | A | | 4/1994 | Strandjord et al. | |
| 5,317,006 | A | | 5/1994 | Kumar et al. | |
| 5,334,302 | A | | 8/1994 | Kubo et al. | |
| 5,403,458 | A | | 4/1995 | Hartig et al. | |
| 5,525,199 | A | * | 6/1996 | Scobey | H01J 37/3405 204/192.12 |
| 5,527,439 | A | | 6/1996 | Sieck et al. | |
| 5,591,314 | A | | 1/1997 | Morgan et al. | |
| 5,660,693 | A | | 8/1997 | Abramson et al. | |
| 5,855,745 | A | | 1/1999 | Manley | |
| 5,989,654 | A | | 11/1999 | Yoshioka et al. | |
| 7,575,661 | B2 | | 8/2009 | Suzuki et al. | |
| 8,163,144 | B2 | | 4/2012 | Tilsch et al. | |
| 9,988,705 | B2 | | 6/2018 | Ockenfuss | |
| 10,920,310 | B2 | * | 2/2021 | Ockenfuss | C23C 14/10 |
| 11,584,982 | B2 | | 2/2023 | Ockenfuss | |
| 2005/0023130 | A1 | | 2/2005 | Suzuki et al. | |
| 2005/0029091 | A1 | | 2/2005 | Park et al. | |
| 2006/0049044 | A1 | | 3/2006 | Seddon | |
| 2008/0223715 | A1 | | 9/2008 | Gibson et al. | |
| 2008/0245657 | A1 | | 10/2008 | Takasawa et al. | |
| 2008/0308411 | A1 | | 12/2008 | Guo et al. | |
| 2010/0200395 | A1 | | 8/2010 | Dietrich et al. | |
| 2011/0253529 | A1 | | 10/2011 | Ockenfuss et al. | |
| 2012/0000768 | A1 | | 1/2012 | O'Keefe et al. | |

FOREIGN PATENT DOCUMENTS

| | | | | |
|---|---|---|---|---|
| CN | 101356297 | A | | 1/2009 |
| CN | 102220561 | A | | 10/2011 |
| EP | 0326405 | A2 | | 8/1989 |
| EP | 0503941 | A1 | | 9/1992 |
| EP | 0970261 | A1 | | 1/2000 |
| EP | 2216424 | A1 | | 8/2010 |
| EP | 2378538 | A2 | | 10/2011 |
| JP | S6436762 | A | | 2/1989 |
| JP | H01108372 | A | | 4/1989 |
| JP | H04507266 | A | | 12/1992 |
| JP | H06293536 | A | | 10/1994 |
| JP | H0770749 | A | | 3/1995 |
| JP | H0817268 | A | | 1/1996 |
| JP | 08-134638 | | * | 5/1996 |
| JP | H1079145 | A | | 3/1998 |
| JP | 2000187892 | A | | 7/2000 |
| JP | 2000192237 | A | | 7/2000 |
| JP | 2000226652 | A | | 8/2000 |
| JP | 2000297367 | A | | 10/2000 |
| JP | 2004296597 | A | | 10/2004 |
| JP | 2005042200 | A | | 2/2005 |
| JP | 2007073697 | A | | 3/2007 |
| JP | 2008192237 | A | | 8/2008 |
| JP | 2010-043334 | | * | 2/2010 |
| JP | 2011225992 | A | | 11/2011 |
| WO | 9102103 | A1 | | 2/1991 |
| WO | 9842890 | A1 | | 10/1998 |
| WO | 2006032925 | A1 | | 3/2006 |
| WO | 2006115530 | A1 | | 11/2006 |
| WO | 2007053586 | A2 | | 5/2007 |

OTHER PUBLICATIONS

Machine Translation JP 08-134638 (Year: 1996).*
Machine Translation JP 2000-192237 (Year: 2000).*
European Search Report for Application No. EP13166446, mailed on Jun. 4, 2013, 2 pages.

* cited by examiner

REACTIVE SPUTTER DEPOSITION OF DIELECTRIC FILMS

CROSS-REFERENCE TO RELATED APPLICATIONS

This application is a continuation of U.S. patent application Ser. No. 17/248,738, filed Feb. 5, 2021 (now U.S. Pat. No. 11,584,982), which is a continuation of U.S. patent application Ser. No. 15/997,079, filed Jun. 4, 2018 (now U.S. Pat. No. 10,920,310), which is a continuation of U.S. patent application Ser. No. 13/887,013, filed May 3, 2013 (now U.S. Pat. No. 9,988,705), which claims priority from U.S. Provisional Patent Application No. 61/642,752 filed May 4, 2012, the disclosures of which are incorporated herein by reference.

TECHNICAL FIELD

The present invention relates to thin film deposition, and in particular to devices and methods for reactive sputter deposition of dielectric films.

BACKGROUND OF THE INVENTION

In a sputter deposition process, a substrate is placed in a vacuum chamber filled with a gas such as argon, termed "sputtering gas", at a low pressure. The material to be sputtered, termed "target", is disposed near the substrate and is electrically connected to a negative electrode, or cathode. A positive electrode, or anode, is disposed nearby within the vacuum chamber. A high negative voltage, between −100 and −1000 Volts, is applied to the cathode, causing ionization of the sputtering gas and a plasma discharge formation above the cathode target. Positively charged sputtering gas ions bombard the negatively charged cathode target, causing atoms of the target to be thrown (sputtered) in space, fly towards the substrate, and adhere to it. In a variety of sputter deposition called reactive sputter deposition, a reactive gas, such as oxygen, is further provided near the substrate surface to immediately enter into a chemical reaction with the freshly adhered atoms, forming a chemical compound film, such as an oxide film. A metal target can be used to sputter metal atoms. When oxygen oxidizes atoms adhered to the substrate, a metal oxide film is formed.

In an endeavor to attain increased deposition rates and lower operating pressures, magnetically enhanced targets have been used. In a planar magnetron, the cathode includes an array of permanent magnets arranged in a closed loop and mounted in a fixed position in relation to the flat target plate. Thus, the magnetic field causes the electrons to travel in a closed loop, commonly referred to as a "race track", which establishes the path or region along which sputtering or erosion of the target material takes place. In a magnetron cathode, a magnetic field confines the glow discharge plasma and increases the path length of the electrons moving under the influence of the electric field. This results in an increase in the gas atom-electron collision probability thereby leading to a much higher sputtering rate than that obtained without the use of magnetic confinement. Furthermore, the sputtering process can be accomplished at a much lower gas pressure.

The introduction of reactive gas into a sputter deposition chamber is known to cause problems. The reactive gas reacts not only with the deposited film but also with the exposed metal of the target, oxidizing the target metal and reducing the sputtering efficiency. Because of this, the reactive gas concentration has an upper practical limit. The reactive gas concentration limit, in its turn, imposes an upper limit on the sputtering rate, because when the sputtering rate is too high, the reactive gas does not react with all sputtered atoms, causing a degradation of the deposited film. As a result, reactive sputter deposition is almost always a much slower process than a corresponding non-reactive sputter deposition.

Reducing reactive gas flow, increasing sputtering gas flow, or increasing cathode power increases the deposition rate in a reactive sputtering process, but results in a higher optical absorption in the deposited film, due to the presence of partially unoxidized metal in the film. The lack of oxidation can be only partially compensated with an higher oxygen flow, because higher oxygen flow rates cause a deposition rate decrease due to reduced sputtering efficiency, as explained above.

Various solutions to the slow deposition rate of reactive metal compounds have been proposed. For example, Scobey et al. in U.S. Pat. No. 4,851,095 disclose a "partial pressure" technique to decouple the deposition and oxidation processes, i.e. to prevent the oxidation gas from entering the deposition zone by creating a dynamic pressure differential of the reactive gas between the deposition and oxidation zones. To achieve this goal, both deposition and reaction zones are made long and narrow, and are disposed adjacent the periphery of a moving substrate carrier in the form of a vertical drum.

Chaplin et al. in European Patent Application EP 0970261 A1 disclose a method and apparatus for sputter deposition of metal oxides or other compounds at enhanced rates, in which the sputter deposition target is placed at a greater than usual distance from the substrate, while the target metallic erosion track is confined to a narrower width than is typical in prior art systems. By reducing the width of the erosion path of the target, the ratio of reacted metal to unreacted metal in the erosion path can be reduced. Moving the target significantly further away than usual from the substrate reduces the deposition rate per unit area on the substrate. This decrease in deposition rate provides additional time for the reaction to occur on the substrate where the reaction is desirable. At the same time, the total area over which deposition is occurring is increased. By increasing the distance between the target and the substrate and reducing the deposition rate per unit area, but increasing the area where deposition occurs, the film thickness on a substrate moving adjacent to the target remains substantially the same, but more reaction occurs at the film.

Detrimentally, the approaches of Scobey and Chaplin require very large vacuum chambers. Furthermore, the reduced width of the erosion target in Chaplin deposition system can potentially reduce coating uniformity, depending on the geometry used. Narrower erosion tracks reduce target utilization; also, narrow erosion tracks can increase power density at the target, which could lead to cracking of the target or even de-bonding due to larger temperature gradients in the target.

SUMMARY OF THE INVENTION

It is a goal of the invention to provide a simple reactive sputter deposition method and system that would enable an increase of the deposition rate substantially without compromising optical quality and composition of the deposited film.

It has been discovered that the presence of a catalyst gas such as water vapor in the reaction chamber shifts the balance between the reactive gas pressure and the sputtering rate, enabling higher overall deposition rates. In particular, adding water vapor at a low partial pressure to the sputter deposition chamber can increase the deposition rates, substantially without compromising the chemical composition and optical transmission of the resulting films.

In accordance with the invention, there is provided a method for reactive sputter deposition of a dielectric compound layer onto a substrate, the method comprising:

(a) providing a reactive sputter deposition chamber having therein a cathode target and the substrate;
(b) pumping out air from the chamber;
(c) providing a sputtering gas and a reactive gas in the chamber;
(d) adding into the chamber an oxidation catalyst, such as water vapor, preferably at a partial pressure of between $5*10^{-6}$ Torr and $5*10^{-4}$ Torr; and
(e) applying a voltage at the cathode, to ionize the sputtering gas and cause positive ions of the sputtering gas to hit the target, causing atoms of the target to fly towards the substrate, adhere to the substrate, react with the reactive gas and with the oxidation catalyst, thereby forming the dielectric compound layer on the substrate;

wherein step (d) enables an increase of a deposition rate of the dielectric compound layer substantially without affecting ultraviolet optical transmission thereof.

In accordance with another aspect of the invention, there is further provided a method for reactive sputter deposition of a dielectric oxide film using sputtering and reactive gases, the method comprising adding to the sputtering or reactive gas of water vapor, ozone, or hydrogen, to increase a deposition rate of the dielectric oxide film substantially without increasing an optical absorption thereof in a wavelength range of between 250 and 750 nm.

In accordance with yet another aspect of the invention, there is further provided a reactive sputter deposition system for coating a substrate with a dielectric coating, the system comprising:

a reactive sputter deposition chamber;
a cathode target within the chamber;
a substrate holder for holding the substrate within the chamber, disposed opposite the cathode target;
a sputtering gas inlet for creating a pre-defined sputtering gas pressure within the chamber;
a reactive gas source within the cathode target for providing a reactive gas; and
a reservoir operatively coupled to the reactive gas source, for containing a mixture of water vapor and the reactive gas.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
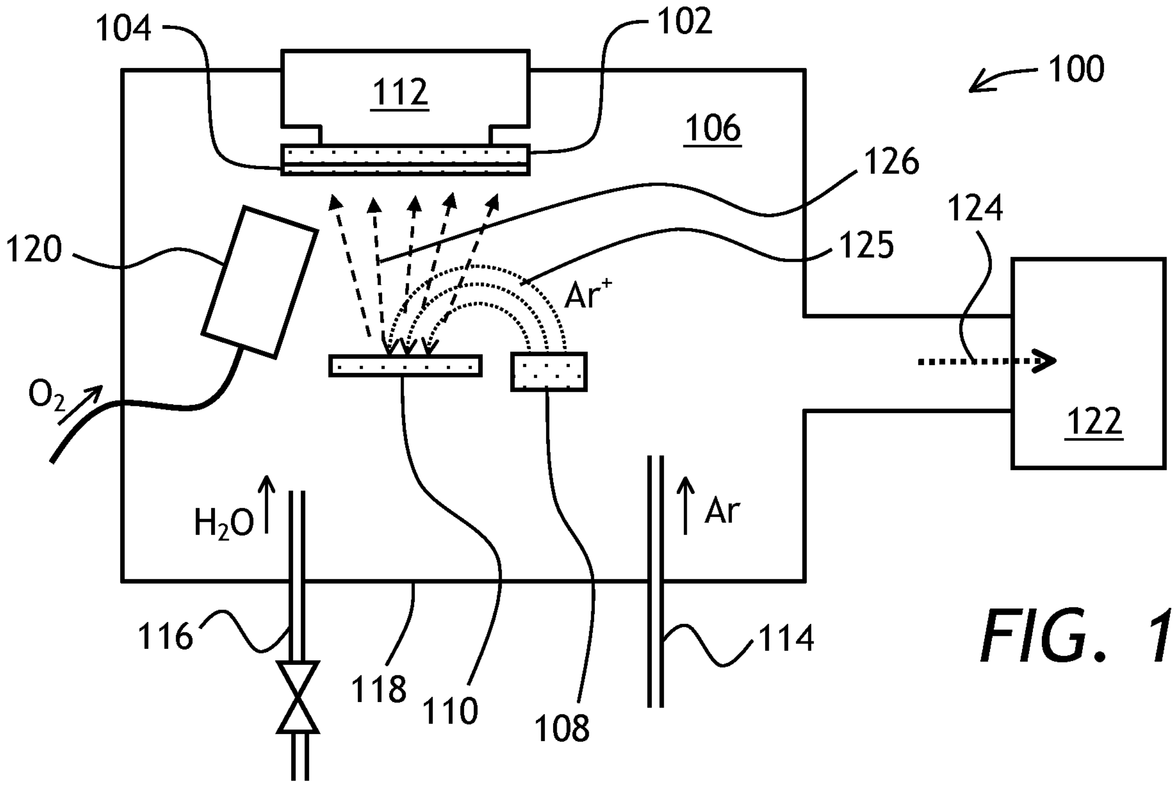
FIG. 1 is a schematic view of a reactive sputter deposition system of the invention.

Referring to FIG. 1, a reactive sputter deposition system 100 for coating a substrate 102 with a dielectric coating 104 includes a sputtering chamber 106, an optional anode 108, and a cathode target 110, disposed within the chamber 106. A substrate holder 112 for holding the substrate 102 is disposed within the chamber 106 opposite the cathode target 110. A sputtering gas inlet 114 and a water vapor inlet 116 are disposed in a bottom wall 118 of the chamber 106. A plasma-activated reactive gas source 120 is placed next to the substrate 102. A vacuum pump 122 is connected to the vacuum chamber 106.

In operation, the substrate 102 is loaded into the substrate holder 112, and the vacuum pump 122 is activated to pump out the air as indicated by an arrow 124. A sputtering gas, in this example argon, is injected via the sputtering gas inlet 114, to a pre-defined pressure within the chamber 106. A reactive gas, in this example oxygen, is supplied to the plasma-activated reactive gas source 120. The cathode target 110 is, in this example, a silicon target. A DC, pulsed DC, AC, or RF voltage is applied to the silicon cathode target 110, causing ionization of the argon. In case of the AC applied voltage, two cathode targets 110 are typically used, and the anode 108 is not required. Positively charged argon ions ($Ar^+$) hit the cathode target 110 as shown with dotted lines 125, causing silicon atoms of the cathode target 110 to fly towards the substrate 102, as shown with dashed lines 126, and adhere to the substrate 102. The plasma-activated reactive gas source 120 releases the oxygen at a pre-defined pressure level. The oxygen reacts with the silicon atoms 126 adhered to the substrate 102, forming the silicon dioxide layer 104 on the substrate 102. The oxidation can also occur in the gas phase between the cathode target 110 and the substrate 102.

The inventors have discovered that adding a catalyst, such as water vapor, to the chamber 106 allows one to increase the deposition rate of the silicon dioxide film 104 substantially without impacting optical absorption spectra of the deposited silicon dioxide film 104. The water vapor was added to the chamber 106 through water vapor inlet 116 at partial pressure levels of between $5*10^{-6}$ Torr and $5*10^{-4}$ Torr.

Figure 2:
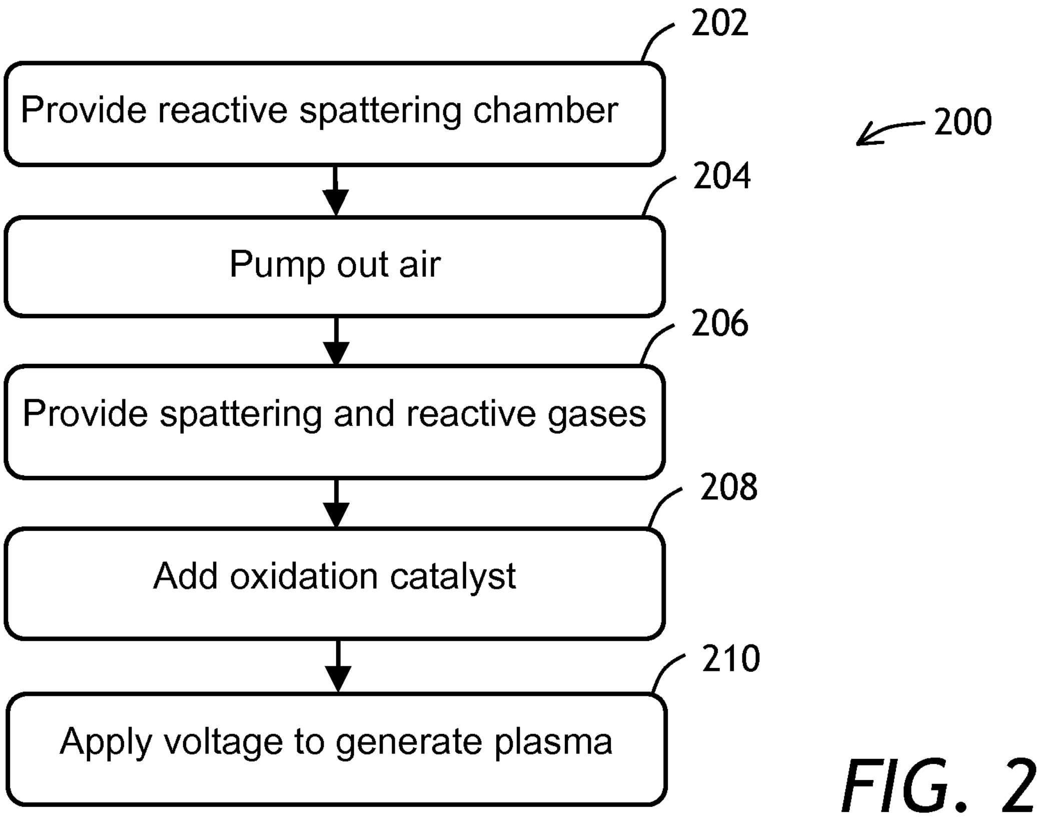
FIG. 2 is a flow chart of a method for the reactive sputter deposition according to the invention, using the reactive sputter deposition system of FIG. 1.

Referring to FIG. 2, a method 200 for reactive sputter deposition of a dielectric compound layer, in this example the silicon dioxide film 104, onto the substrate 102, includes a step 202 of providing the reactive sputtering chamber 106. In a step 204, air is pumped out from the chamber 106. In a step 206, the sputtering gas (e.g. argon) and the reactive gas (e.g. oxygen) are provided in the chamber 106. In a step 208, the oxidation catalyst, such as water vapor, is added in the chamber 106, preferably at a partial pressure of between $5*10^{-6}$ Torr and $5*10^{-4}$ Torr, and more preferably at $1*10^{-5}$ Torr and $5*10^{-5}$ Torr. In a step 210, a voltage is applied at the cathode target 110, to ionize the argon gas and cause argon ions to hit the cathode target 110, causing silicon atoms of the cathode target 110 to fly towards the substrate 102, adhere to the substrate 102, and react with the oxygen and the water vapor, thereby forming the silicon dioxide film 104 on the substrate 102. In the step 208, the water vapor can be added by feeding the oxygen gas through a water bubbler.

Figure 3:
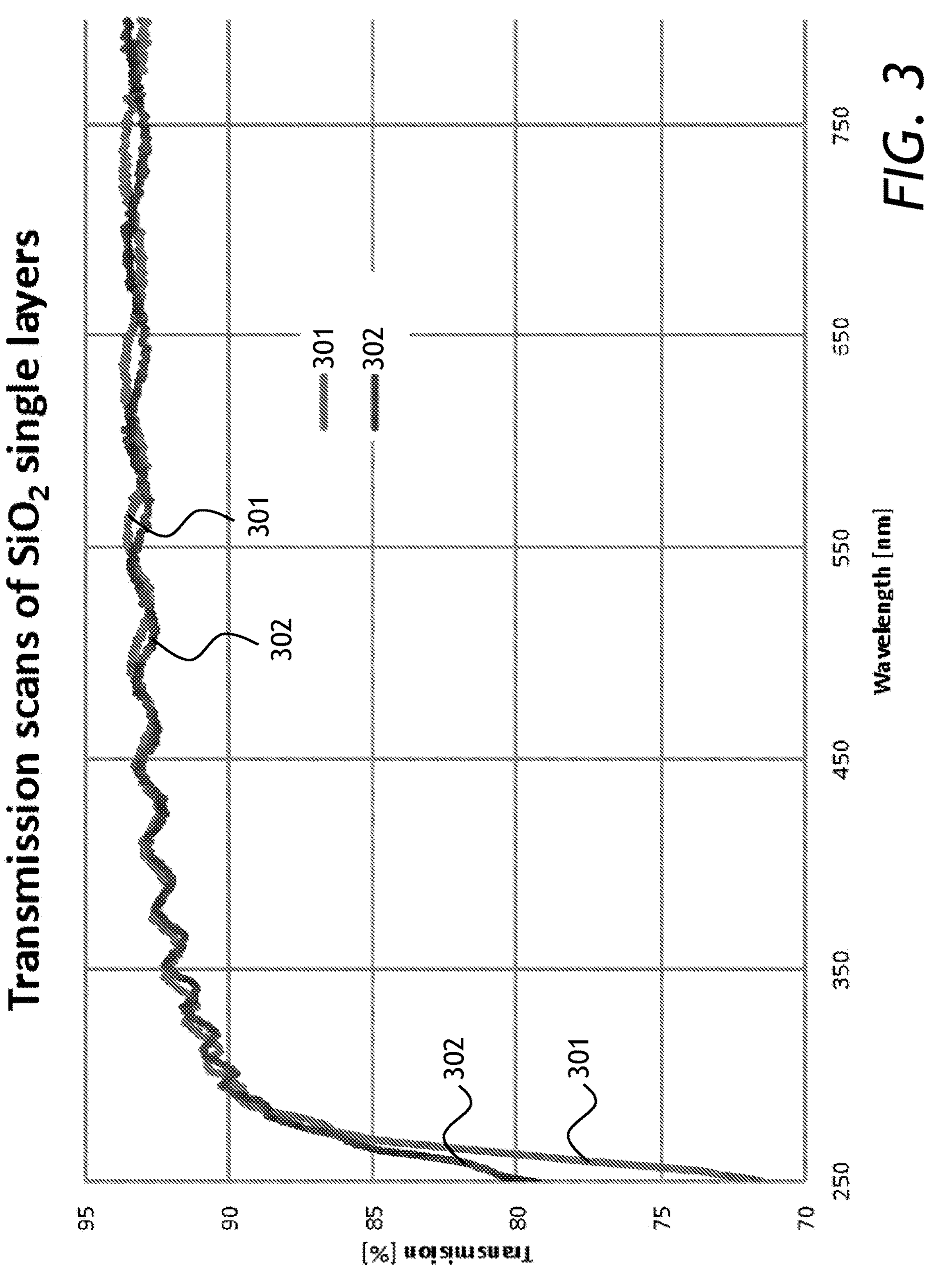
FIG. 3 is an optical transmission plot of $SiO_2$ layers grown using the system of FIG. 1, with addition of water vapor at a normal and an increased deposition rate.

Adding the water vapor in the step 208 has been found to increase the deposition rate of the silicon dioxide layer 104, substantially without affecting ultraviolet optical transmission of the silicon dioxide layer 104. Referring to FIG. 3, a measured optical spectrum 301 corresponds to a silicon dioxide sample obtained after 30 minutes of deposition at a rate of 0.84 nm/s at the total pressure of $3.5*10^{-7}$ Torr, and no water vapor added. An optical spectrum 302 corresponds to a silicon dioxide sample obtained after 30 minutes of deposition at a deposition rate increased by 10%, to 0.92 mn/s, at the partial water vapor pressure of $3*10^{-5}$ Torr. One can clearly see that the optical transmission spectrum is substantially unaffected at the wavelength of between 270 nm and 800 nm. The optical transmission between 250 nm and 270 nm is actually improved. The smaller wavelength ripple period of the spectrum 302 obtained with water vapor indicates that in 30 minutes of deposition at the increased deposition rate, a thicker silicon dioxide layer 104 was indeed formed. This result indicates that adding water vapor to the reactive sputtering chamber 106 improves the deposition rate by at least 10% without increasing a percentage of unoxidized silicon atoms in the silicon dioxide film 104.

Figure 4:
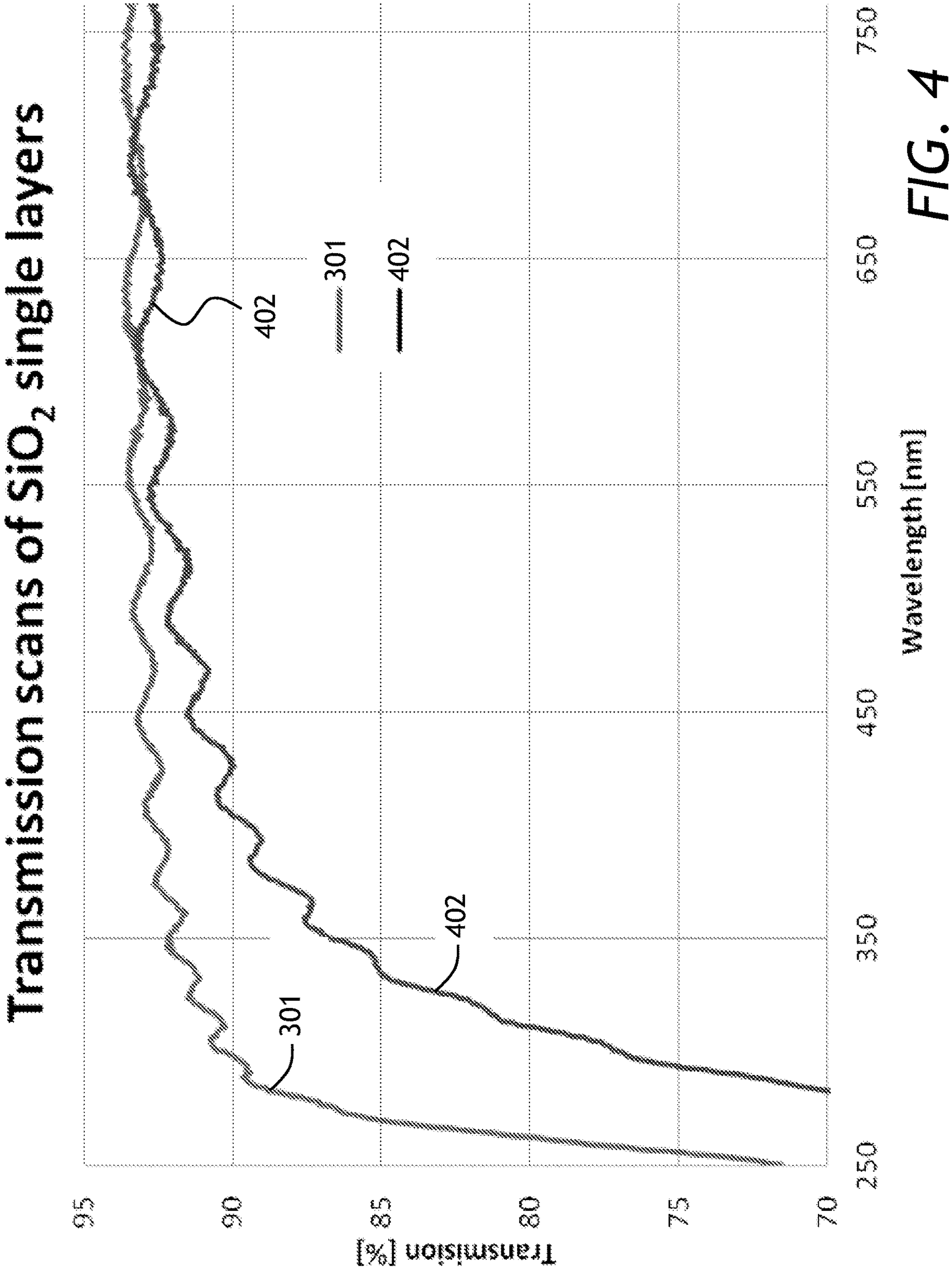
FIG. 4 is an optical transmission plot of $SiO_2$ layers grown using the reactive sputter deposition system of FIG. 1, without addition of water vapor at a normal and an increased deposition rate.

To verify that the increased deposition rate is indeed due to the presence of the water vapor, a control experiment was performed, in which the sputtering rate was increased in absence of water vapor. Turning now to FIG. 4, the optical spectrum 301 is reproduced from FIG. 3 for comparison. A control optical spectrum 402 corresponds to a silicon dioxide sample obtained after 30 minutes of deposition at the increased deposition rate of 0.92 mn/s, however without addition of water vapor. One can see that the optical transmission in the control experiment was considerably worse, especially in the ultraviolet wavelength range of 250 nm to 450 nm. In contrast, the UV wavelength range of the second transmission spectrum 302 of FIG. 3 is essentially unaffected. Thus, adding water vapor at a partial pressure of between $5*10^{-6}$ Torr and $5*10^{-4}$ Torr enables an increase of a deposition rate of the silicon dioxide layer 104 substantially without affecting ultraviolet optical transmission of the silicon dioxide layer 104.

The water vapor partial pressure range of between $1*10^{-5}$ Torr and $5*10^{-5}$ Torr is preferred. In all cases, the pumping speed was approximately 10,800 l/s, resulting in a gas flow of between 20 sccm and 30 sccm; the gas flow of 25 sccm+−2 sccm was found to be optimal for $SiO_2$.

The water vapor can be introduced into the chamber 106 via a needle valve, to supply small controllable amounts of liquid water. The needle, not shown, can protrude inside the chamber and be hidden behind a shield, for example protective foil, not shown. The water vapor can also be obtained outside the chamber 106 by evaporating a small amount of water and adding the vapor to the oxygen supplied to the plasma activated oxygen source 120. The pre-formed water vapor can also be fed through the anode 108. For process control purposes, it is advantageous to introduce the water vapor with the other processes gasses, especially with the reactive gas, feeding the mixture of the reactive gas and water vapor into the plasma activated gas source 120.

The cathode target 110 can include silicon, aluminum, titanium, and other metals or semiconductors. The sputtering gas can include not only argon but another, preferably inert, gas such as neon, krypton, or xenon. The sputtering gas is selected to match the atomic mass of the target material as closely as possible for better transfer of mechanical impulse upon collision of the sputtering ions with the atoms of the target 110.

Various atomic groups of the water molecules may act as a catalyst to improve the oxidation efficiency of the reactive sputtering process. Applying a high negative voltage at the cathode target 110 creates a plasma in front of the cathode target 110, where positively charged argon ions are accelerated towards the negatively charged cathode target 110. A second function of the plasma, additional to the plasma created at the plasma activated oxygen source 120, is to create activated atomic oxygen and oxygen ions. These excited oxygen species can oxidize metals much more efficiently than $O_2$ molecules. Water now dissociates in the plasma and can form $H^+$, $H_2$, $O^*$, $O^-$, or $HO^-$ species. All of the oxygen containing ones improve the oxidation efficiency.

One probable mechanism is that $H_2O$ molecules dissociate into $H_2$ and O, and that the atomic oxygen O combines more easily with the metal atoms in the sputtering bloom than molecular oxygen $O_2$. Adding ozone ($O_3$) may also increase the deposition efficiency without impacting the optical absorption spectra in the wavelength ranges specified. Another possibility is that OH— is formed in the plasma which will be accelerated away from the negatively charged cathode target 110, and will recombine not at the target surface but either in the sputter bloom, or on the substrate 102, or a wall of the chamber 106, increasing the probability of oxidizing the growing film 104. Another possible mechanism is that the hydrogen forming upon $H_2O$ molecules dissociation may assist oxidization of the film 104. Thus, hydrogen may be used in place of water vapor in the system 100 of FIG. 1 operated according to the method 200 of FIG. 2. To deposit the dielectric oxide film 104 on the substrate 102, water vapor, ozone gas, or hydrogen gas are added to the reactive gas, to increase the deposition rate of the dielectric oxide film 104 substantially without increasing an optical absorption of the film 104 in the wavelength range of between 250 and 750 nm, or at least between 420 nm and 750 nm, depending on the oxide film material.

Figure 5:
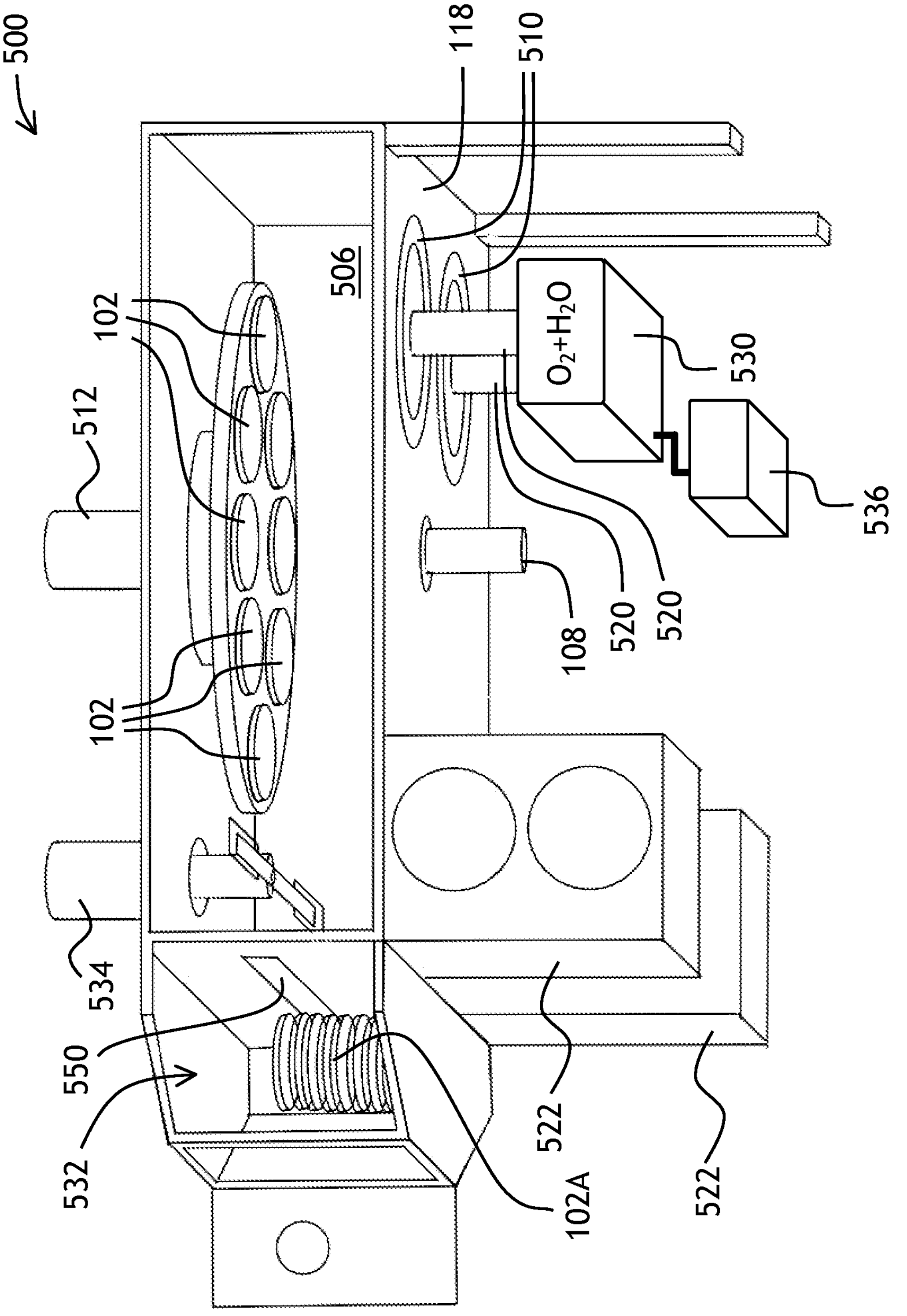
FIG. 5 is a three-dimensional partially cut-out view of an embodiment of the reactive sputter deposition system of FIG. 1.

Turning now to FIG. 5 with further reference to FIG. 1, a preferred embodiment 500 of the reactive sputtering deposition system 100 is presented. A multi-substrate holder 512 of the reactive magnetron sputtering deposition system 500 rotates about a vertical axis within a chamber 506 for simultaneous deposition of the coating, not shown, onto a plurality of the substrates 102. A pair of ring cathode targets 510 are used in place of the single cathode target 110. The mixture of the reactive gas and the water vapor is fed through a pair of inlets 520 disposed at the centers of the corresponding ring cathode targets 510. The inlets 520 are connected to a reservoir 530 having therein the reactive gas pre-mixed with the water vapor provided by an optional water vapor source 536, which can include a water vaporizer. An optional loading dock 532 contains a cassette 102A of extra substrates for subsequent loading into the chamber 506 through the gate valve 550 by means of a substrate handler 534. The turbo pumps 522 pump the air out of the chamber 506. The mixture of the reactive gas and the water vapor can also be added through the anode 108.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A system, comprising:

a chamber;

a sputtering gas inlet configured to provide a sputtering gas into the chamber;

a cathode ring configured to ionize the sputtering gas;

a reservoir configured to have a reactive gas mixed with a water vapor;

an inlet disposed at a center of the cathode ring and connected to the reservoir, wherein the inlet is configured to provide a mixture of the reactive gas and the water vapor to the chamber, and wherein a formation of a coating is based on the reactive gas, the water vapor, and ionization of the sputtering gas; and a substrate holder configured to:

hold a plurality of substrates; and rotate about an axis within the chamber for simultaneous deposition of the coating onto the plurality of substrates.

2. The system of claim 1, wherein the substrate holder is disposed within the chamber.

3. The system of claim 1, wherein the inlet is disposed in a bottom wall of the chamber.

4. The system of claim 1, wherein the coating comprises silicon dioxide film.

5. The system of claim 1, wherein the sputtering gas inlet is configured to provide the sputtering gas to a pre-defined pressure within the chamber.

6. The system of claim 1, wherein the sputtering gas inlet is disposed in a bottom wall of the chamber.

7. The system of claim 1, wherein the sputtering gas is argon.

8. The system of claim 1, further comprising:

a vacuum pump configured to pump air out of the chamber.

9. The system of claim 1, wherein the reactive gas is oxygen that reacts with silicon atoms adhered to the plurality of substrates in a manner that forms the coating.

10. The system of claim 1, further comprising:

a water vapor source including a water vaporizer.

11. The system of claim 1, further comprising:

another inlet configured to provide the mixture of the reactive gas and the water vapor to the chamber.

12. The system of claim 11, further comprising:

another cathode ring, wherein the other inlet is disposed at a center of the other cathode ring.

13. A system, comprising:

a chamber;

a sputtering gas inlet configured to provide a sputtering gas into the chamber;

a cathode ring configured to ionize the sputtering gas;

a reservoir configured to have a reactive gas mixed with a water vapor;

an inlet disposed at a center of the cathode ring and connected to the reservoir, wherein the inlet is configured to provide a mixture of the reactive gas and the water vapor to the chamber, and wherein a formation of a coating is based on the reactive gas, the water vapor, and ionization of the sputtering gas; and a substrate holder configured to hold a plurality of substrates to be coated with the coating.

14. The system of claim 13, wherein the inlet is disposed in a bottom wall of the chamber.

15. The system of claim 13, wherein the coating comprises silicon dioxide film.

16. The system of claim 13, wherein the sputtering gas includes argon and another inert gas.

17. The system of claim 16, wherein the other inert gas comprises one of neon, krypton, or xenon.

18. The system of claim 13, further comprising:

a loading dock containing one or more other substrates for loading into the chamber.

19. A system, comprising:

a chamber configured to:

receive a sputtering gas; and receive a mixture of a reactive gas and a water vapor;

a cathode ring;

a reservoir configured to have the reactive gas mixed with the water vapor;

an inlet disposed at a center of the cathode ring and connected to the reservoir, wherein the inlet is configured to provide the mixture of the reactive gas and the water vapor to the chamber; and a substrate holder disposed within the chamber and configured to:

hold a plurality of substrates to be coated with a coating formed based on the reactive gas, the water vapor, and ionization of the sputtering gas.

20. The system of claim 19, further comprising:

an anode configured to provide the mixture of the reactive gas and the water vapor to the chamber.

* * * * *